United States Patent
Pillarisetty et al.

(10) Patent No.: US 7,884,354 B2
(45) Date of Patent: Feb. 8, 2011

(54) GERMANIUM ON INSULATOR (GOI) SEMICONDUCTOR SUBSTRATES

(75) Inventors: Ravi Pillarisetty, Portland, OR (US);
Been-Yih Jin, Lake Oswego, OR (US);
Willy Rachmady, Beaverton, OR (US);
Marko Radosavljevic, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 316 days.

(21) Appl. No.: 12/183,565

(22) Filed: Jul. 31, 2008

(65) Prior Publication Data

US 2010/0025822 A1 Feb. 4, 2010

(51) Int. Cl.
*H01L 29/06* (2006.01)
*H01L 31/00* (2006.01)

(52) U.S. Cl. .............................. 257/19; 257/55; 257/63; 257/65; 257/609; 257/E29.104; 257/E29.193; 257/E31.035; 257/E33.009

(58) Field of Classification Search .................... 257/19, 257/E29.104, E29.193, E31.035, E33.009, 257/609, 55, 63, 65
See application file for complete search history.

(56) References Cited

U.S. PATENT DOCUMENTS

| | | | |
|---|---|---|---|
| 6,645,831 B1 | 11/2003 | Shaheen et al. | |
| 6,825,506 B2 | 11/2004 | Jin et al. | |
| 6,900,481 B2 | 5/2005 | Jin et al. | |
| 6,909,151 B2 | 6/2005 | Hareland et al. | |
| 6,974,738 B2 | 12/2005 | Hareland et al. | |
| 7,138,316 B2 | 11/2006 | Jin et al. | |
| 7,193,279 B2 | 3/2007 | Doyle et al. | |
| 7,235,809 B2 | 6/2007 | Jin et al. | |
| 7,268,058 B2 | 9/2007 | Chau et al. | |
| 7,279,375 B2 | 10/2007 | Radosavljevic et al. | |
| 7,348,284 B2 | 3/2008 | Doyle et al. | |
| 2003/0075738 A1* | 4/2003 | Chang ........................ 257/213 |
| 2004/0031990 A1 | 2/2004 | Jin et al. | |
| 2004/0113210 A1 | 6/2004 | Chau et al. | |
| 2005/0124125 A1 | 6/2005 | Jin et al. | |
| 2008/0132081 A1 | 6/2008 | Shaheen et al. | |
| 2008/0142785 A1 | 6/2008 | Datta et al. | |

(Continued)

OTHER PUBLICATIONS

Hudait, Mantu K., et al., "Forming Arsenide-Based Complementary Logic on a Single Substrate", U.S. Appl. No. 11/712,191, filed Feb. 28, 2007.

(Continued)

*Primary Examiner*—Long K Tran
(74) *Attorney, Agent, or Firm*—Cool Patent, P.C.; Joseph P. Curtin (57) ABSTRACT

Germanium on insulator (GOI) semiconductor substrates are generally described. In one example, a GOI semiconductor substrate comprises a semiconductor substrate comprising an insulative surface region wherein a concentration of dopant in the insulative surface region is less than a concentration of dopant in the semiconductor substrate outside of the insulative surface region and a thin film of germanium coupled to the insulative surface region of the semiconductor substrate wherein the thin film of germanium and the insulative surface region are simultaneously formed by oxidation anneal of a thin film of silicon germanium ($Si_{1-x}Ge_x$) deposited to the semiconductor substrate wherein x is a value between 0 and 1 that provides a relative amount of silicon and germanium in the thin film of $Si_{1-x}Ge_x$.

14 Claims, 5 Drawing Sheets

U.S. PATENT DOCUMENTS

2008/0142786 A1 6/2008 Datta et al.
2008/0169512 A1 7/2008 Doyle et al.

OTHER PUBLICATIONS

Jin, Been Y., et al., "Transistor Having Tensile Strained Channel and System Including Same", U.S. Appl. No. 11/729,564, filed Mar. 29, 2007.

Hudait, Mantu K., et al., "High Hole Mobility Semiconductor Device", U.S. Appl. No. 11/823,516, filed Jun. 28, 2007.

Blackwell, James M., et al., "High K Dielectric Growth on Metal Triflate or Trifluoroacetate Terminated III-V Semiconductor Surfaces", U.S. Appl. No. 11/694,781, filed Mar. 30, 2007.

Jin, Been Y., et al., "Mechanism for Forming a Remote Delta Doping Layer of a Quantum Well Structure", U.S. Appl. No. 11/731,266, filed Mar. 29, 2007.

Jin, Been Y., et al., "Method to Introduce Uniaxial Strain in Multigate Nanoscale Transistors by Self Aligned Si to SiGe Conversion Processes and Structures Formed Thereby", U.S. Appl. No. 11/864,726, filed Sep. 28, 2007.

Jin, Been Y., et al., "Silicon Germanium and Germanium Multigate and Nanowire Structures for Logic and Multilevel Memory Applications", U.S. Appl. No. 11/729,565, filed Mar. 29, 2007.

Pillarisetty, Ravi et al., "Double Quantum Well Structures for Transistors", U.S. Appl. No. 12/058,063, filed Mar. 28, 2008.

Pillarisetty, Ravi et al., "Semiconductor Heterostructures to Reduce Short Channel Effects", U.S. Appl. No. 12/058,101, filed Mar. 28, 2008.

* cited by examiner

GERMANIUM ON INSULATOR (GOI) SEMICONDUCTOR SUBSTRATES

BACKGROUND

Generally, semiconductor substrates comprise semiconductor materials upon which one or more transistor devices may be formed. Semiconductor substrates comprising germanium are emerging as material structures upon which transistor devices may be formed for electronic devices.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

For simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of germanium on insulator (GOI) semiconductor substrates are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout the specification to "one embodiment" or "an embodiment" means that a particular feature, structure or characteristic described in connection with the embodiment is included in at least one embodiment. Thus, appearances of the phrases "in one embodiment" or "in an embodiment" in various places throughout the specification are not necessarily referring to the same embodiment. Furthermore, the particular features, structures or characteristics may be combined in any suitable manner in one or more embodiments.

Figure 1:
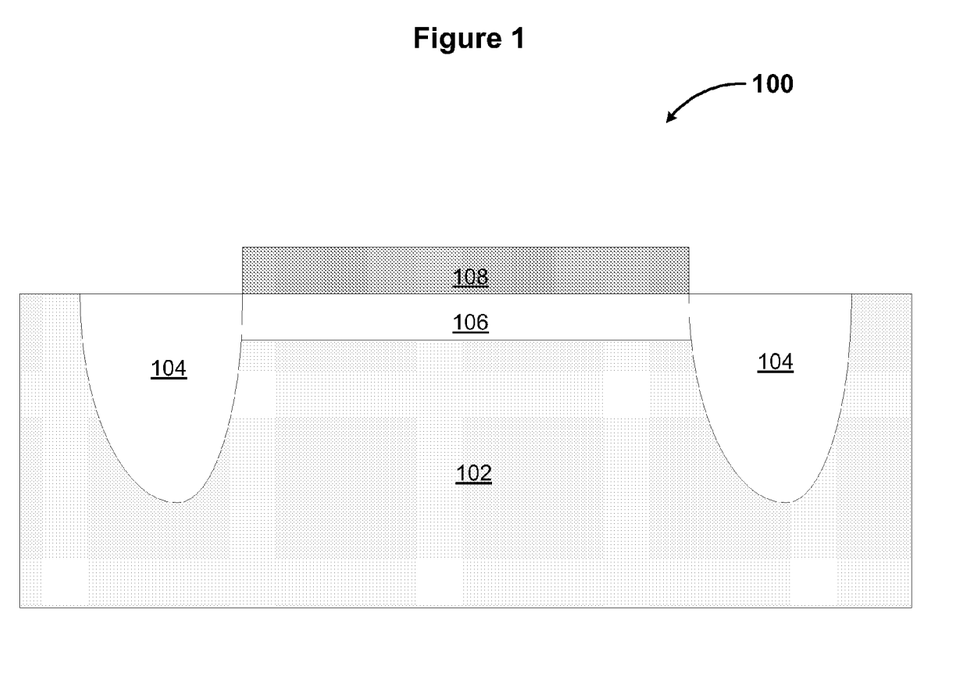
FIG. 1 is an elevation cross-section schematic of a germanium on insulator (GOI) semiconductor substrate, according to but one embodiment.

FIG. 1 is an elevation cross-section schematic of a germanium on insulator (GOI) semiconductor substrate, according to but one embodiment. In an embodiment, a GOI semiconductor substrate 100 comprises a semiconductor substrate 102, an insulative surface region 106 of the semiconductor substrate 102, and a thin film of germanium 108, coupled as shown. In another embodiment, GOI semiconductor substrate 100 further comprises one or more isolation dielectric structures 104 coupled with the semiconductor substrate 102 as shown.

GOI semiconductor substrate 100 may comprise a doped semiconductor substrate 102. In an embodiment, semiconductor substrate 102 comprises p-type or n-type dopant. Dopants including boron, phosphorous, or arsenic, for example, may be introduced in a variety of ways including, for example, diffusion during ingot manufacture or various subsequent diffusion and/or implant processes. Semiconductor substrate 102 may comprise a bulk silicon substrate. In an embodiment, semiconductor substrate 102 comprises a p-type doped bulk silicon substrate. In another embodiment, the dopant comprises boron.

GOI semiconductor substrate 100 may further comprise an insulative surface region 106 of the semiconductor substrate 102. Insulative surface region 106 may electrically insulate a thin film of germanium 108 from doped semiconductor substrate 102. In an embodiment, insulative surface region 106 comprises a concentration of dopant that is less than a concentration of dopant in the semiconductor substrate 102 outside of the insulative surface region 106. In an embodiment, the concentration of dopant in the insulative surface region 106 is similar to the concentration of dopant in intrinsic silicon. Intrinsic may refer to an impurity level commensurate with a material that is not intentionally doped with the impurity. In another embodiment, the concentration of dopant in the insulative surface region 106 is from about $10^{12}$ to about $10^{15}$ atoms/cm$^3$ and the concentration of dopant in the semiconductor substrate 102 outside of the insulative surface region 106 is about $10^{18}$ atoms/cm$^3$.

A thin film of germanium 108 may be coupled to the insulative surface region 106 of the semiconductor substrate 102. A thin film of germanium 108 may be a thin film comprising mostly or substantially germanium. In an embodiment, thin film of germanium 108 is physically coupled to the insulative surface region 106 of the semiconductor substrate 102. Thin film of germanium 108 may be epitaxially coupled to the insulative surface region 106. In an embodiment, the thin film of germanium 108 and the insulative surface region 106 are simultaneously formed by oxidation anneal of a thin film of silicon germanium ($Si_{1-x}Ge_x$) deposited to the semiconductor substrate 102 where x is a value between 0 and 1 that provides a relative amount of silicon and germanium in the thin film of $Si_{1-x}Ge_x$. In an embodiment, x is from about 0.2 to about 0.8. The thin film of $Si_{1-x}Ge_x$ may comprise a thickness from about 200 angstroms (Å) to about 2000 Å of substantially intrinsic silicon germanium $Si_{1-x}Ge_x$.

An oxidation anneal may simultaneously form the insulative surface region 106 and the thin film of germanium 108 by condensing the thin film of germanium 108 from the thin film of $Si_{1-x}Ge_x$ onto the semiconductor substrate 102, substantially oxidizing the silicon of the thin film of $Si_{1-x}Ge_x$ for subsequent removal, and segregating dopant from the semiconductor substrate 102 to the thin film of germanium 108 to form the insulative surface region 106 of the semiconductor substrate. The segregation of dopants away from the semiconductor substrate 102 may create the insulative surface region 106 while the segregation of dopants into the thin film of germanium 108 may create a doped thin film of germanium 108. In an embodiment, the thin film of germanium 108 comprises p-type dopants that have segregated from the insulative surface region 106 of the semiconductor substrate 102 upon heating to a temperature above about 1000° C.

GOI semiconductor substrate 100 may further comprise one or more isolation dielectric structures 104 coupled with the semiconductor substrate 102. In an embodiment, the one or more isolation dielectric structures 104 are formed in the semiconductor substrate to provide shallow trench isolation (STI) for one or more electronic devices formed on the semiconductor substrate 102.

Figure 2:
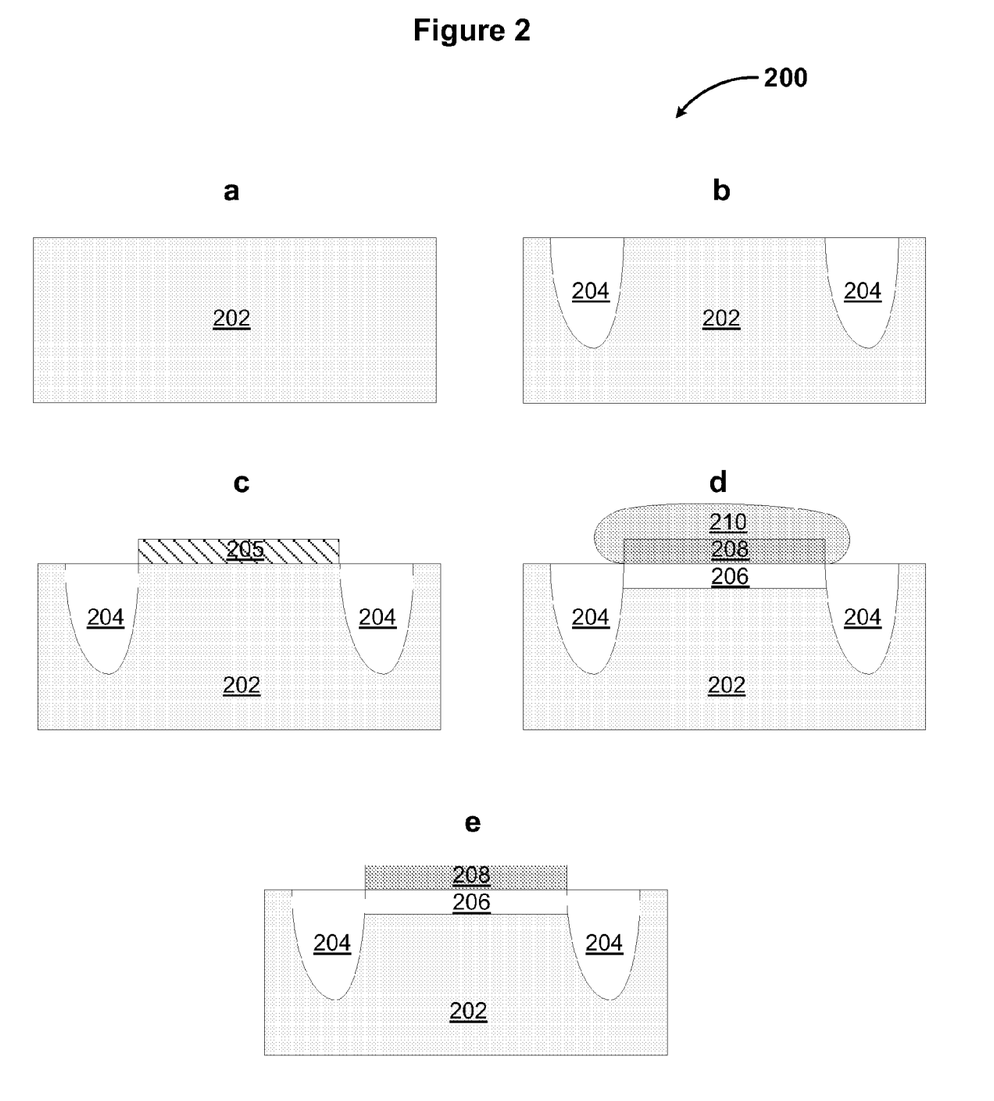
FIG. 2 is an elevation cross-section process schematic for fabricating a GOI semiconductor substrate, according to but one embodiment.

FIG. 2 is an elevation cross-section process schematic for fabricating a GOI semiconductor substrate, according to but one embodiment. FIG. 2a may depict a semiconductor substrate 202, FIG. 2b may depict a semiconductor substrate according to FIG. 2a after forming one or more isolation dielectric structures 204, FIG. 2c may depict a semiconductor substrate 202 according to FIG. 2b after depositing a thin film of silicon germanium ($Si_{1-x}Ge_x$) 205, FIG. 2d may represent a semiconductor substrate 202 according to FIG. 2c after oxidation anneal to condense a thin film of germanium 208 and form an insulative region 206, and FIG. 2e may represent a semiconductor substrate 202 according to FIG. 2d after removing oxidized silicon 210.

In an embodiment according to FIG. 2a, a semiconductor substrate 202 for forming a germanium on insulator (GOI) semiconductor substrate is provided. In an embodiment, semiconductor substrate 202 comprises p-type or n-type dopants. Dopants including boron, phosphorous, or arsenic, for example, may be introduced in a variety of ways including, for example, diffusion during ingot manufacture or various subsequent diffusion and/or implant processes. Semiconductor substrate 202 may comprise a bulk silicon substrate. In an embodiment, semiconductor substrate 202 comprises a p-type doped bulk silicon substrate. In another embodiment, the dopant comprises boron. Semiconductor substrate 202 may accord with embodiments already described with respect to FIG. 1.

In an embodiment according to FIG. 2b, one or more isolation dielectric structures 204 are formed in the semiconductor substrate 202. One or more isolation dielectric structures may be formed by, for example, etching trench structures into the semiconductor substrate 202 and depositing a dielectric material to the trench structures. Polish and/or other semiconductor fabrication processes may be used as well. One or more isolation dielectric structures 204 may provide shallow trench isolation (STI) for one or more electronic devices formed on the semiconductor substrate 202. One or more electronic devices may include transistor devices or structures. In an embodiment, forming one or more isolation dielectric 204 structures in the semiconductor substrate 202 occurs prior to depositing the thin film of $Si_{1-x}Ge_x$ 205. In another embodiment, forming one or more isolation dielectric 204 structures in the semiconductor substrate 202 occurs after performing the oxidation anneal as depicted in FIG. 2d. In yet another embodiment, no isolation dielectric 204 structures are formed at all. The semiconductor substrate 202 may be used in applications, for example, where STI 204 is not necessary.

In an embodiment according to FIG. 2c, a thin film of $Si_{1-x}Ge_x$ 205 is deposited to a surface of the doped semiconductor substrate 202 where x is a value between 0 and 1 that provides a relative amount of silicon and germanium in the thin film of $Si_{1-x}Ge_x$ 205. Deposition of the thin film of $Si_{1-x}Ge_x$ 205 may comprise deposition by molecular beam epitaxy (MBE), atomic layer epitaxy (ALE), epitaxial growth, chemical beam epitaxy (CBE), metal-organic chemical vapor deposition (MOCVD), any other suitable deposition method, or combinations thereof. In an embodiment, the thin film of silicon germanium, $Si_{1-x}Ge_x$ 205 comprises a thickness from about 200 angstroms (Å) to about 2000 Å of substantially intrinsic silicon germanium $Si_{1-x}Ge_x$ wherein x is from about 0.2 to about 0.8.

In an embodiment according to FIG. 2d, an oxidation anneal is performed that condenses a thin film of germanium 208 from the $Si_{1-x}Ge_x$ thin film 205 onto the surface of the semiconductor substrate 202, substantially oxidizes the silicon 210 of the $Si_{1-x}Ge_x$ thin film 205, and segregates the dopants of the semiconductor substrate 202 near the surface to the condensed thin film of germanium 208 to form an insulative region 206 in the semiconductor substrate 202 adjacent to the thin film of germanium 208. The oxidation anneal may comprise introducing the semiconductor substrate 202 to an oxidizing agent such as oxygen, for example, at a temperature greater than about 1000° C.

The insulative region 206 may be formed by segregation of dopants away from the insulative region 206 of the semiconductor substrate 202 into the thin film of germanium 208, which may alter the electrical properties of both the insulative region 208 by making it less electrically conductive and the thin film of germanium 208 by making it more electrically conductive. In an embodiment, the insulative region 206 in the semiconductor substrate 202 adjacent to the thin film of germanium 208 comprises a concentration of dopant from about $10^{12}$ to about $10^{15}$ atoms/cm$^3$ and wherein a concentration of dopant in the semiconductor substrate 202 outside of the insulative surface region 206 is about $10^{18}$ atoms/cm$^3$. Oxidation anneal may oxidize silicon of the $Si_{1-x}Ge_x$ thin film 205 to silicon oxide ($SiO_2$) 210, which may be removed by polish, etch, or any other suitable removal method to form a germanium 208 on insulator 206 (GOI) semiconductor substrate 202 as depicted in FIG. 2e.

FIG. 2 and associated description may further include other semiconductor fabrication processes such as lithography, etch, thin films deposition, planarization, diffusion, metrology, or any other associated action with semiconductor fabrication. In one or more embodiments, process schematic 200 includes embodiments described with respect to other figures herein.

Figure 3:
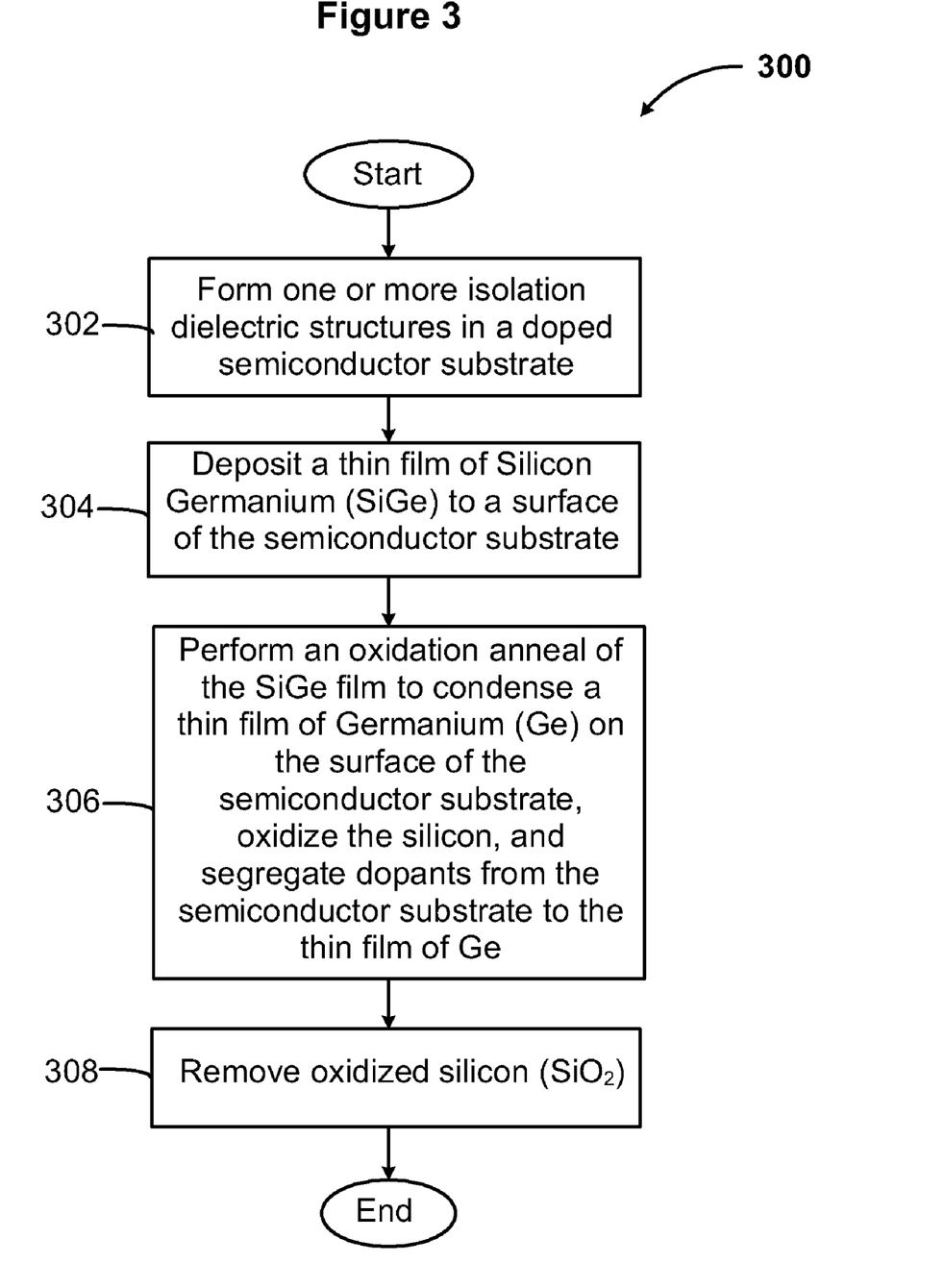
FIG. 3 is a flow diagram of a method for fabricating a GOI semiconductor substrate, according to but one embodiment.

FIG. 3 is a flow diagram of a method for fabricating a GOI semiconductor substrate, according to but one embodiment. In an embodiment, method 300 includes forming one or more isolation dielectric structures in a doped semiconductor substrate at box 302, depositing a thin film of silicon germanium (SiGe) to a surface of the semiconductor substrate at box 304, performing an oxidation anneal of the SiGe film to condense a thin film of Germanium (Ge) on the surface of the semiconductor substrate, oxidize the silicon, and segregate dopants from the semiconductor substrate to the thin film of Ge at box 306, and removing the oxidized silicon ($SiO_2$) at box 308.

Method 300 may include forming one or more isolation dielectric structures in the semiconductor substrate 302. One or more isolation dielectric structures may be formed 302 by, for example, etching trench structures into the semiconductor substrate and depositing a dielectric material to the trench structures. Polish and/or other semiconductor fabrication processes may be used as well. One or more isolation dielectric structures may provide shallow trench isolation (STI) for one or more electronic devices formed on the semiconductor substrate. One or more electronic devices may include transistor devices or structures. In an embodiment, forming one or more isolation dielectric structures in the semiconductor substrate 302 occurs prior to depositing the thin film of $Si_{1-x}Ge_x$ 304. In another embodiment, forming one or more isolation dielectric structures in the semiconductor substrate 302 occurs after performing the oxidation anneal 306 as described with respect to FIG. 4.

Method 300 may further include depositing a thin film of germanium depositing a thin film of silicon germanium ($Si_{1-x}Ge_x$) to a surface of a doped semiconductor substrate 304 wherein the semiconductor substrate comprises silicon and dopant and wherein x is a value between 0 and 1 that provides a relative amount of silicon and germanium in the thin film of $Si_{1-x}Ge_x$. The semiconductor substrate may be a bulk p-type doped silicon substrate. A p-type dopant may comprise, for example, boron. Depositing a thin film of $Si_{1-x}Ge_x$ 304 may comprise depositing by molecular beam epitaxy (MBE), atomic layer epitaxy (ALE), epitaxial growth, chemical beam epitaxy (CBE), metal-organic chemical vapor deposition (MOCVD), or combinations thereof. Depositing the thin film of silicon germanium, $Si_{1-x}Ge_x$, to the surface of the semiconductor substrate 304 may further comprise depositing a thickness from about 200 angstroms (Å) to about 2000 Å of substantially intrinsic silicon germanium $Si_{1-x}Ge_x$ wherein x is from about 0.2 to about 0.8.

Method 300 may further include performing an oxidation anneal 306 wherein the oxidation anneal condenses a thin film of germanium from the $Si_{1-x}Ge_x$ thin film onto the surface of the semiconductor substrate, substantially oxidizes the silicon of the $Si_{1-x}Ge_x$ thin film, and segregates the dopants of the semiconductor substrate near the surface to the condensed thin film of germanium to form an insulative region in the semiconductor substrate adjacent to the thin film of germanium. Performing the oxidation anneal 306 may comprise introducing the semiconductor substrate to an oxidizing agent at a temperature greater than about 1000° C. Heating may cause dopant segregation to form an insulative region in the semiconductor substrate. In an embodiment, oxidation anneal 306 changes a concentration of dopant in the insulative region from about $10^{18}$ atoms/cm$^3$ to a concentration of dopant from about $10^{12}$ to about $10^{15}$ atoms/cm$^3$ wherein a concentration of dopant in the semiconductor substrate outside of the insulative region is about $10^{18}$ atoms/cm$^3$.

Performing an oxidation anneal 306 may further oxidize silicon from the $Si_{1-x}Ge_x$ thin film, which can subsequently be removed 308. Oxidized silicon ($SiO_2$) may be removed 308 by any suitable removal process. In an embodiment, method 300 further comprises substantially removing the oxidized silicon 308 of the $Si_{1-x}Ge_x$ thin film by polishing the oxidized silicon.

Method 300 and associated actions may further include other semiconductor fabrication processes such as lithography, etch, thin films deposition, planarization, diffusion, metrology, or any other associated action with semiconductor fabrication. In one or more embodiments, method 300 includes embodiments already described with respect to FIGS. 1-2.

Figure 4:
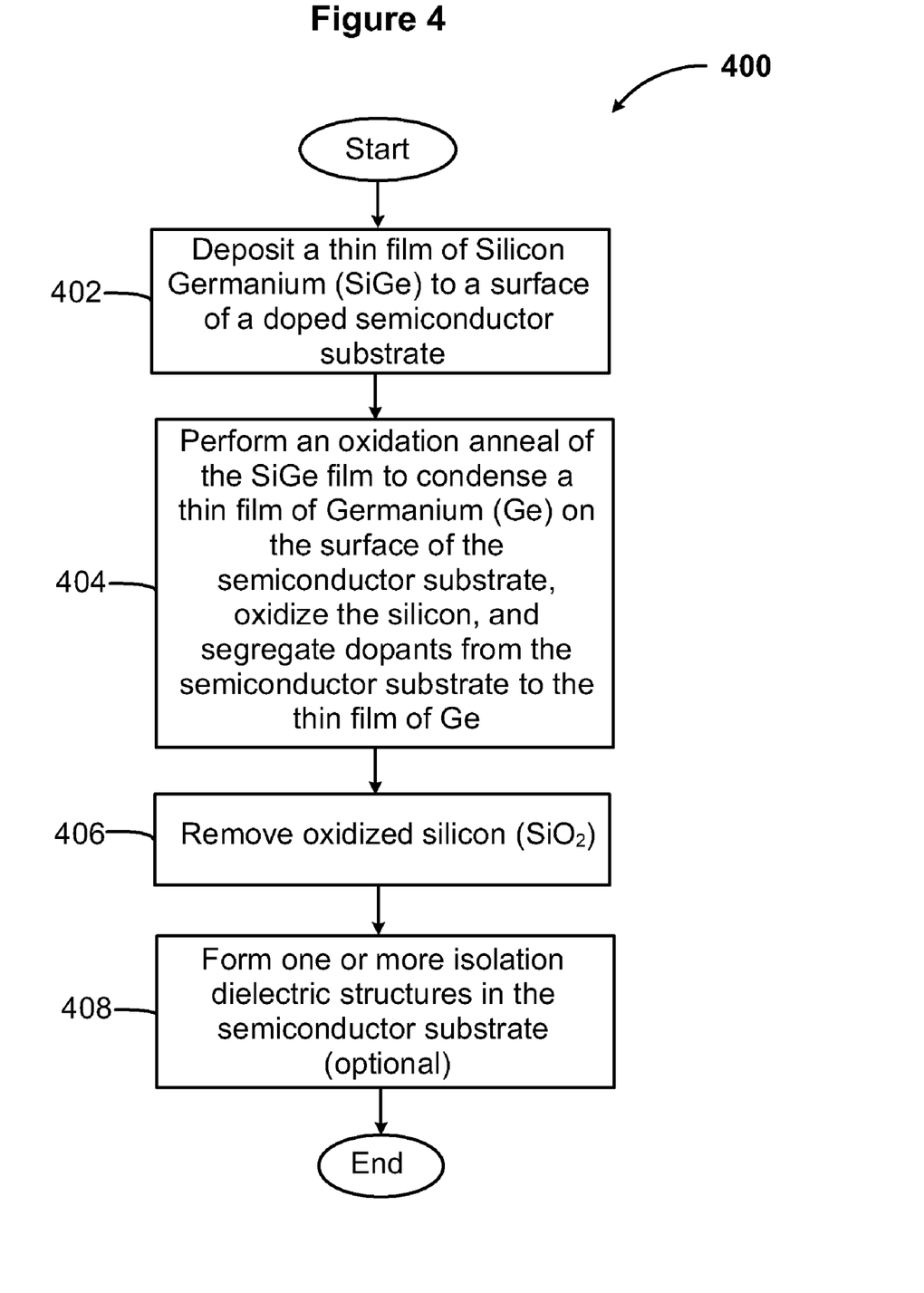
FIG. 4 is a flow diagram of another method for fabricating a GOI semiconductor substrate.

FIG. 4 is a flow diagram of another method for fabricating a GOI semiconductor substrate. In an embodiment, method 400 comprises depositing a thin film of silicon germanium (SiGe) to a surface of a doped semiconductor substrate at box 402, performing an oxidation anneal of the SiGe film to condense a thin film of Germanium (Ge) on the surface of the semiconductor substrate, oxidize the silicon, and segregate dopants from the semiconductor substrate to the thin film of Ge at box 404, removing oxidized silicon ($SiO_2$) at box 406, and forming one or more isolation dielectric structures in the semiconductor substrate at box 408.

In an embodiment according to method 400, one or more isolation dielectric structures are formed in the semiconductor substrate 408 after an oxidation anneal 404. Forming one or more isolation dielectric structures 408 is optional in an embodiment. A GOI semiconductor substrate may be used in applications that don't require one or more isolation dielectric structures. Method 400 may allow blanket deposition of a thin film of silicon germanium (SiGe) to a semiconductor substrate 402 such as a silicon wafer.

Method 400 and associated actions may further include other semiconductor fabrication processes such as lithography, etch, thin films deposition, planarization, diffusion, metrology, or any other associated action with semiconductor fabrication. In one or more embodiments, method 400 includes embodiments already described with respect to FIGS. 1-3. Methods disclosed herein may provide a more cost-effective method to fabricate a GOI semiconductor substrate using a bulk silicon substrate compared with using, for example, a silicon-on-insulator (SOI) substrate.

Various operations may be described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 5:
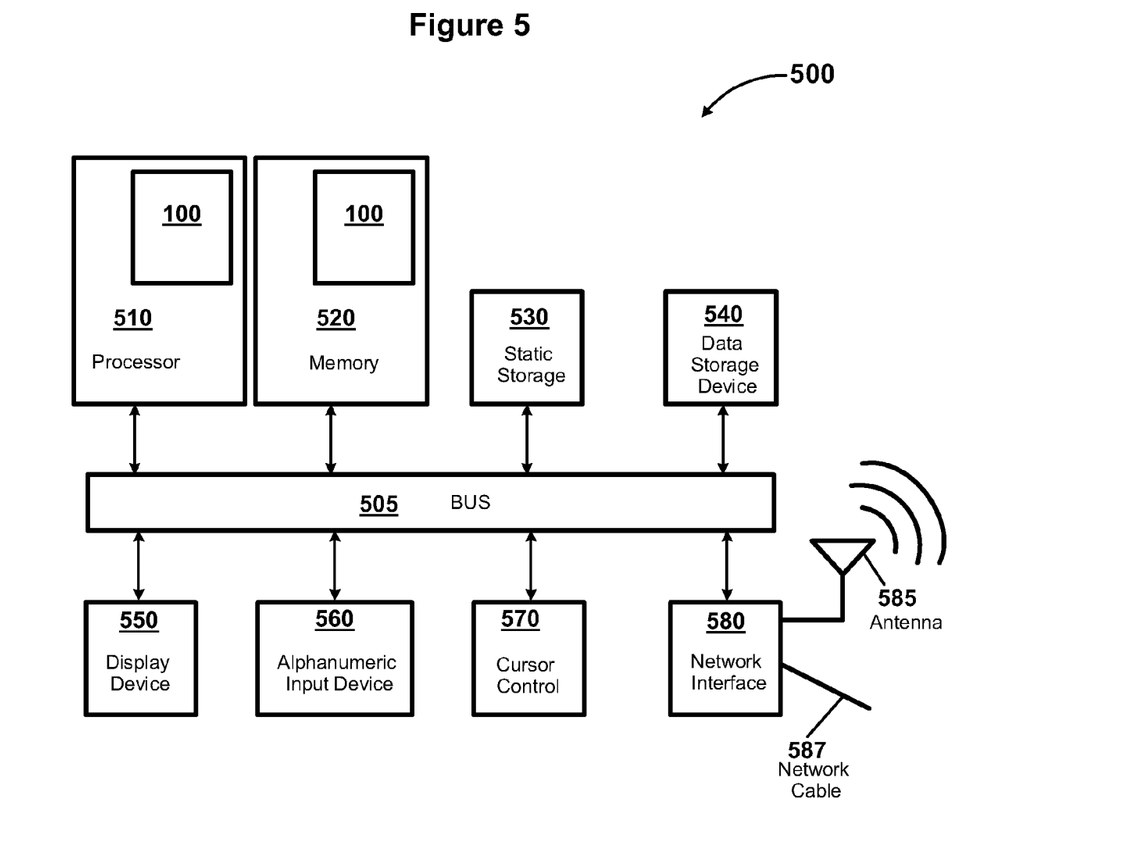
FIG. 5 is a diagram of an example system in which a GOI semiconductor substrate as described herein may be used, according to but one embodiment.

FIG. 5 is a diagram of an example system in which a GOI semiconductor substrate as described herein may be used, according to but one embodiment. System 500 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 500 includes a germanium on insulator (GOI) semiconductor substrate 100 as described herein. In an embodiment, a germanium on insulator (GOI) semiconductor substrate 100 as described herein is part of an electronic system's processor 410 or memory 420. Electronic system 500 may include a processor 510 and memory 520 coupled with the processor 510, wherein the processor 510 or the memory 520, or combinations thereof, comprise a germanium on insulator (GOI) semiconductor substrate 100. In an embodiment, the processor 510 or the memory 520, or combinations thereof, comprise a p-type metal-oxide-semiconductor (PMOS) electronic device or an n-type metal-oxide-semiconductor (NMOS) electronic device.

Electronic system 500 may include bus 505 or other communication device to communicate information, and processor 510 coupled to bus 505 that may process information. While electronic system 500 may be illustrated with a single processor, system 500 may include multiple processors and/or co-processors. In an embodiment, processor 510 includes a germanium on insulator (GOI) semiconductor substrate 100 in accordance with embodiments described herein. System 500 may also include random access memory (RAM) or other storage device 520 (may be referred to as memory), coupled to bus 505 and may store information and instructions that may be executed by processor 510.

Memory 520 may also be used to store temporary variables or other intermediate information during execution of instructions by processor 510. Memory 520 is a flash memory device in one embodiment. In another embodiment, memory 520 includes a germanium on insulator (GOI) semiconductor substrate 100 as described herein.

System 500 may also include read only memory (ROM) and/or other static storage device 530 coupled to bus 505 that may store static information and instructions for processor 510. Data storage device 540 may be coupled to bus 505 to store information and instructions. Data storage device 540 such as a magnetic disk or optical disc and corresponding drive may be coupled with electronic system 500.

Electronic system 500 may also be coupled via bus 505 to display device 550, such as a cathode ray tube (CRT) or liquid crystal display (LCD), to display information to a user. Alphanumeric input device 560, including alphanumeric and other keys, may be coupled to bus 505 to communicate information and command selections to processor 510. Another type of user input device is cursor control 570, such as a mouse, a trackball, or cursor direction keys to communicate information and command selections to processor 510 and to control cursor movement on display 550.

Electronic system 500 further may include one or more network interfaces 580 to provide access to network, such as a local area network. Network interface 580 may include, for example, a wireless network interface having antenna 585, which may represent one or more antennae. Network interface 580 may also include, for example, a wired network interface to communicate with remote devices via network cable 587, which may be, for example, an Ethernet cable, a coaxial cable, a fiber optic cable, a serial cable, or a parallel cable.

In one embodiment, network interface 580 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 580 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of the description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. An apparatus comprising:
    a semiconductor substrate comprising an insulative surface region wherein a concentration of dopant in the insulative surface region is less than a concentration of dopant in the semiconductor substrate outside of the insulative surface region; and
    a thin film of germanium coupled to the insulative surface region of the semiconductor substrate wherein the thin film of germanium and the insulative surface region are simultaneously formed by oxidation anneal of a thin film of silicon germanium ($Si_{1-x}Ge_x$) deposited to the semiconductor substrate wherein x is a value between 0 and 1 that provides a relative amount of silicon and germanium in the thin film of $Si_{1-x}Ge_x$.

2. An apparatus according to claim 1 wherein the semiconductor substrate comprises a p-type doped bulk silicon substrate.

3. An apparatus according to claim 1 wherein the concentration of dopant in the insulative surface region is from about $10^{12}$ to about $10^{15}$ atoms/cm$^3$ and wherein the concentration of dopant in the semiconductor substrate outside of the insulative surface region is about $10^{18}$ atoms/cm$^3$.

4. An apparatus according to claim 1 wherein the dopant comprises boron.

5. An apparatus according to claim 1 wherein the oxidation anneal condenses the thin film of germanium from the thin film of $Si_{1-x}Ge_x$ onto the semiconductor substrate, substantially oxidizes the silicon of the thin film of $Si_{1-x}Ge_x$ for removal, and segregates dopant from the semiconductor substrate to the thin film of germanium to form the insulative surface region of the semiconductor substrate.

6. An apparatus according to claim 1 wherein the thin film of silicon germanium, $Si_{1-x}Ge_x$ comprises a thickness from about 200 angstroms (Å) to about 2000 Å of substantially intrinsic silicon germanium $Si_{1-x}Ge_x$ wherein x is from about 0.2 to about 0.8.

7. An apparatus according to claim 1 further comprising:
    one or more isolation dielectric structures formed in the semiconductor substrate to provide shallow trench isolation (STI) for one or more electronic devices formed on the semiconductor substrate.

8. A system comprising:
    a processor; and
    a memory coupled with the processor, wherein the processor or the memory, or combinations thereof, comprise:
        a semiconductor substrate comprising an insulative surface region wherein a concentration of dopant in the insulative surface region is less than a concentration of dopant in the semiconductor substrate outside of the insulative surface region; and
        a thin film of germanium coupled to the insulative surface region of the semiconductor substrate wherein the thin film of germanium and the insulative surface region are simultaneously formed by oxidation anneal of a thin film of silicon germanium ($Si1_{-x}Ge_x$) deposited to the semiconductor substrate wherein x is a value between 0 and 1 that provides a relative amount of silicon and germanium in the thin film of $Si_{1-x}Ge_x$.

9. A system according to claim 8 wherein the semiconductor substrate comprises a p-type doped bulk silicon substrate.

10. A system according to claim 8 wherein the concentration of dopant in the insulative surface region is from about $10^{12}$ to about $10^{15}$ atoms/cm$^3$ and wherein the concentration of dopant in the semiconductor substrate outside of the insulative surface region is about $10^{18}$ atoms/cm$^3$.

11. A system according to claim 8 wherein the dopant comprises boron.

12. A system according to claim 8 wherein the oxidation anneal condenses the thin film of germanium from the thin film of $Si_{1-x}Ge_x$ onto the semiconductor substrate, substantially oxidizes the silicon of the thin film of $Si_{1-x}Ge_x$ for removal, and segregates dopant from the semiconductor substrate to the thin film of germanium to form the insulative surface region of the semiconductor substrate.

13. A system according to claim 8 wherein the thin film of silicon germanium, $Si_{1-x}Ge_x$ comprises a thickness from about 200 angstroms (Å) to about 2000 Å of substantially intrinsic silicon germanium $Si_{1-x}Ge_x$ wherein x is from about 0.2 to about 0.8.

14. A system according to claim 8 further comprising:

one or more isolation dielectric structures formed in the semiconductor substrate to provide shallow trench isolation (STI) for one or more transistor devices of the processor or the memory, or combinations thereof, formed on the semiconductor substrate.

\* \* \* \* \*